(12) United States Patent
Hirotsuru et al.

(10) Patent No.: US 6,447,894 B1
(45) Date of Patent: Sep. 10, 2002

(54) SILICON CARBIDE COMPOSITE, METHOD FOR PRODUCING IT AND HEAT DISSIPATION DEVICE EMPLOYING IT

(75) Inventors: Hideki Hirotsuru; Kenji Nomura; Ryuichi Terasaki; Mitsuaki Saito; Kazuyuki Hiruta; Akira Miyai, all of Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/432,568

(22) Filed: Nov. 12, 1999

(30) Foreign Application Priority Data

| Nov. 12, 1998 | (JP) | 10-322054 |
| Dec. 18, 1998 | (JP) | 10-360482 |
| Oct. 6, 1999 | (JP) | 11-285429 |

(51) Int. Cl.[7] .................................................. B32B 3/26
(52) U.S. Cl. ................ 428/307.7; 428/545; 428/317.9; 428/318.4; 428/319.1; 428/313.3; 428/313.9; 428/315.9
(58) Field of Search .............................. 428/545, 307.7, 428/317.9, 318.4, 319.1, 313.3, 313.9, 315.9

(56) References Cited

U.S. PATENT DOCUMENTS 4,390,220 A * 6/1983 Benasutti ...................... 339/17
5,746,267 A 5/1998 Yun et al.

FOREIGN PATENT DOCUMENTS

| EP | 0 368 789 | 5/1990 |
| EP | 0 646 958 | 5/1995 |

OTHER PUBLICATIONS

Hornor et al, "Preform Based Metal Matrix Composite Fabrication for Electronic Carrier Applications," Society for the Advancement of Material and Process Engineering, 6th International SAMPE Electronics Conference, Jun. 22–25, 1992, pp. 295–307.*

* cited by examiner

Primary Examiner—Blaine Copenheaver
Assistant Examiner—Hai Vo
(74) Attorney, Agent, or Firm—Oblon, Spivak, McClelland, Maier & Neustadt, P.C.

(57) ABSTRACT

A silicon carbide composite which is a flat composite comprising a porous preform of silicon carbide and a metal containing aluminum as the main component, infiltrated into the porous preform, said composite having a warpage of at most 250 $\mu$m per 10 cm of the principal plane length of the composite.

11 Claims, 6 Drawing Sheets

SILICON CARBIDE COMPOSITE, METHOD FOR PRODUCING IT AND HEAT DISSIPATION DEVICE EMPLOYING IT

FIELD OF THE INVENTION

The present invention relates to a highly thermal-conductive silicon carbide composite material having excellent thermal conductive characteristics, having a light weight, and suitable as a heatsink for semiconductor parts such as a ceramic substrate or an IC package, a method for producing it and a heat dissipation device employing it.

BACKGROUND OF THE INVENTION

Along with enlargement of the capacity of semiconductor elements and high-integration of semiconductor elements in the semiconductor field in recent years, it has been an important theme how to discharge heat energy generated from a semiconductor element to the exterior effectively. A semiconductor element is usually loaded on an insulating substrate such as a ceramic substrate. In such a case, generated heat from the semiconductor element is discharged to the exterior by means of a heatsink provided on e.g. the back side of the substrate, to secure performance characteristics of the semiconductor element.

Conventionally, copper (Cu) has been mainly used for the material of the heatsink. Although copper has a coefficient of thermal conductivity of as high as 390 W/mK at a temperature in the vicinity of room temperature, it has a high coefficient of thermal expansion of $17 \times 10^{-6}$/K, and accordingly, cracks or fractures may form on a ceramic substrate due to a difference in thermal expansion between the ceramic substrate (coefficient of thermal expansion: $7-8 \times 10^{-6}$/K) and the heatsink, by addition of thermal cyclings. Conventionally, when the ceramic substrate for a heat dissipation device is used in such a field that reliability is required, e.g. Mo/W having a small difference in the coefficient of thermal expansion with the ceramic substrate, has been used as the heatsink.

Although the above-described Mo/W heatsink has an excellent reliability, it has a coefficient of thermal conductivity of as low as 150 W/mK, such being problematic in view of heat dissipation characteristics, and further, such a heatsink is expensive. Under these circumstances, an attention has been drawn to a metal-ceramic composite which comprises ceramic fibers or particles and copper or aluminum alloy reinforced by the ceramic fibers or particles, which is referred to simply as MMC (Metal Matrix Composite) in recent years. Such a composite is usually made in such a manner that ceramic fibers or particles as a reinforcing material are preliminarily formed to prepare a preform, and a metal as a base material (matrix) is infiltrated into the fibers or particles of the preform. As the reinforcing material, a ceramic such as alumina, silicon carbide, aluminum nitride, silicon nitride, silica or carbon may be employed. However, wettability of the ceramic as the reinforcing material and the alloy as the matrix, and the reaction layer at the interface therebetween, significantly affect the coefficient of thermal conductivity of the composite.

For the above-mentioned composite, to increase the coefficient of thermal conductivity, it is necessary to select a reinforcing material and an alloy having a high coefficient of thermal conductivity, and to decrease the coefficient of thermal expansion, it is necessary to select a reinforcing material having a low coefficient of thermal expansion. Accordingly, a composite of silicon carbide with aluminum alloy has been mainly studied.

However, with respect to the heat dissipation device comprising a conventional ceramic substrate and heatsink bonded to each other, as mentioned above, when a heavy-metal material such as Mo or W is employed for the heatsink, the heat dissipation device will be heavy, and heat dissipation properties will not be adequate. On the other hand, when e.g. Cu or Al, being relatively light and having excellent heat dissipation properties, is used as the heatsink, the difference in thermal expansion with the ceramic substrate will be large, and in order to obtain a structure with high reliability, the bonding structure itself will be extremely complicated, thus leading to increase in production costs and increase in thermal resistance as the heat dissipation device. Accordingly, with respect to the conventional heat dissipation device having bonding structure of the ceramic substrate and the heatsink, it has been objects to simplify the bonding structure, and to improve reliability and heat dissipation properties.

On the other hand, to overcome the above-mentioned problems, a metal-ceramic composite has been studied. However, in order to obtain a coefficient of thermal expansion close to the ceramic substrate, it is necessary to increase the ratio of the ceramic as a reinforcing material having a low coefficient of thermal expansion. To increase the ratio of the ceramic component, it is necessary to form a preform under a high forming pressure, whereby the cost will be high, and subsequent infiltration of the alloy may not be adequately carried out. Accordingly, it has been an object to develop techniques to provide a metal-ceramic composite having a coefficient of thermal expansion close to the ceramic substrate and having a high coefficient of thermal conductivity with a low cost.

Further, when such a composite is used as the heat dissipation device, the composite will be soldered to a circuit substrate, and accordingly, if the warpage of the composite is too large, the soldering will be difficult. Accordingly, when such a composite is used as the heat dissipation device, it is required to control the warpage within a certain amount. On the other hand, a device having such a heat dissipation device incorporated therewith, such as a power module, is usually fixed on e.g. a heat dissipation fin by screws. In such a case, the bonding surface between the device such as a power module and the heat dissipation fin is preferably convex so that a stress is applied on the bonding surface, in view of heat dissipation property since screw force after screwing will be high. However, with respect to the conventional metal-ceramic composite, in order to optionally add a shape such as warpage, as mentioned above, there is no way except adjustment by mechanical processing. In such a case, the metal-ceramic composite will be extremely hard, the mechanical processing cost will be high, and the device itself will be extremely expensive.

SUMMARY OF THE INVENTION

Under these circumstances, the present invention has been made to provide a composite which has a high thermal conductivity, a small specific gravity and a coefficient of thermal expansion close to the ceramic substrate, which has warpage, and which can be tightly bonded to e.g. a heat dissipation device, and a heat dissipation device employing it, with a low cost.

The present inventors have been made extensive studies to achieve the above-mentioned objects, and as a result, they have found that characteristics such as the coefficient of thermal expansion and the shape of the composite can be controlled by adjusting the composition and the structure of the composite, and the present invention has been accomplished.

Namely, the present invention provides a silicon carbide composite which is a flat composite comprising a porous preform of silicon carbide and a metal containing aluminum as the main component, infiltrated into the porous preform, said composite having a warpage of at most 250 μm per 10 cm of the principal plane length of the composite.

The present invention further provides a silicon carbide composite which is a flat composite having at least 4 holes in its plane, and having a relation of $50 \leq Cx \leq 250$ and $-50 \leq Cy \leq 200$, where Cx is a warpage (μm) per 10 cm in a hole-to-hole direction (X direction) and Cy is a warpage (μm) per 10 cm in a direction perpendicular thereto (Y direction).

The present invention further provides a silicon carbide composite having both front and back sides covered with a metal layer containing aluminum as the main component with an average thickness of from 10 to 150 μm, with a difference in the average thickness between the front and back metal layers of at most 140 μm.

The present invention further provides a silicon carbide composite which is a flat composite comprising a composite portion (A) and a metal layer (B) containing aluminum as the main component, provided on at least one side of the composite, and having a ratio of TA/TB of from 5 to 30, where TA is the average thickness (μm) of the composite portion (A) and TB is the total of the average thicknesses (μm) of the metal layers (B) on both sides.

The present invention further provides the above-mentioned silicon carbide composite, wherein the warpage is from 50 to 250 μm per 10 cm of the principal plane length of the composite, and the product of |TB1−TB2| and the maximum length of the composite (L; cm) is from 500 to 2500, where |TB1−TB2| is the absolute value of the difference between the average thickness of the front metal layer (B) (TB1; μm) and the average thickness of the back metal layer (B) (TB2; μm).

The present invention further provides a silicon carbide composite comprising a porous preform of silicon carbide and having a stepped portion on at least one principal plane of the preform.

The present invention further provides a silicon carbide composite which is a composite having two flat composites (C and D) and metal layers (E) containing aluminum as the main component, laminated to have a structure of ECEDE, wherein the difference in the carbon content between the flat composites (C) and (D) is from 0.5 to 2.5 wt %, and the warpage is from 50 to 250 μm per 10 cm of the principal plane length of the composite.

The present invention further provides a method for producing a silicon carbide composite, which comprises applying stress on a silicon carbide composite at a temperature of at least 350° C. for plastic deformation, to obtain warpage.

The present invention further provides a silicon carbide composite which has an average coefficient of thermal expansion of at most $9 \times 10^{-6}$/K when heated from room temperature (25° C.) to 150° C., and a coefficient of thermal conductivity of at least 150 W/mK at room temperature (25° C.).

The present invention further provides a heat dissipation device which comprises a flat composite and a ceramic substrate for semiconductor bonded thereto.

The present invention further provides a heat dissipation device which comprises a ceramic substrate made of aluminum nitride and/or silicon nitride.

The present invention further provides the above-mentioned heat dissipation device, wherein when the side having no ceramic substrate bonded thereto is subjected to bonding to a plate by means of a heat dissipation grease, at least 90% of said side adheres to the plate under a screw torque of at least 2N.

DETAILED DESCRIPTION OF THE INVENTION

Figure 1A:
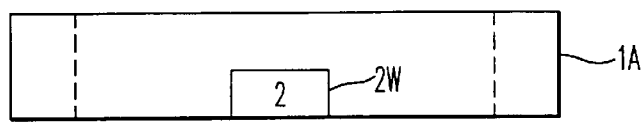
FIGS. 1a, 1b and 1c are a plan view and side views illustrating a mold to be used in Examples of the present invention.
Figure 1B:
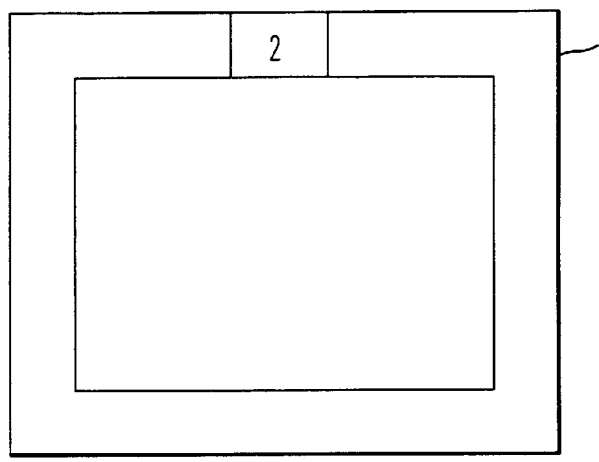
Figure 1C:
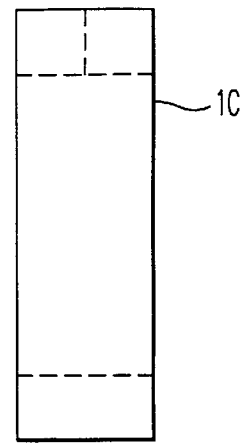

Referring to the drawings; In FIGS. 1a, 1b and 1c, the reference characters 1a, 1b and 1c indicate mutually perpendicular views of the frame of the mold used in the Examples. 2W designates the wall of a recess 2 in the frame.

Figure 2A:
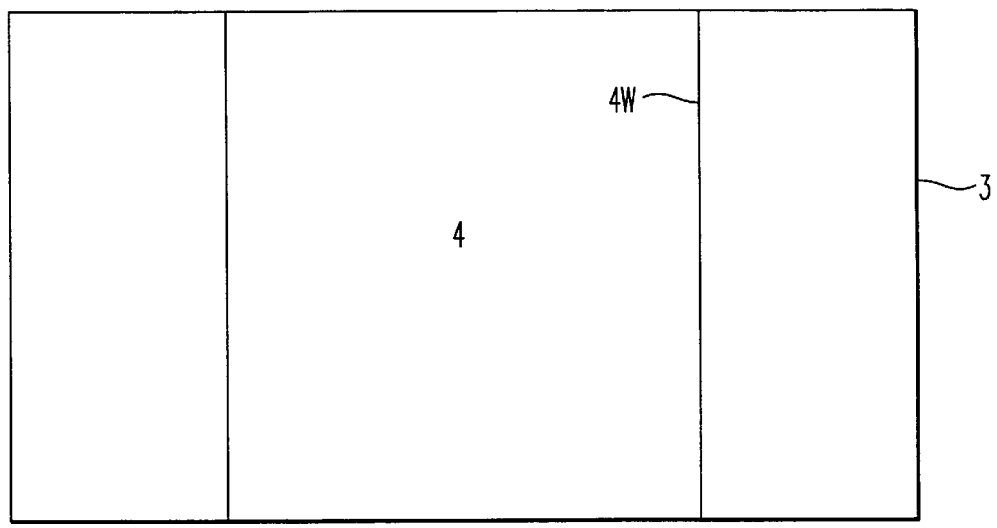
FIGS. 2a and 2b illustrate an example of a porous preform of silicon carbide to be used for the composite of the present invention.
Figure 2B:
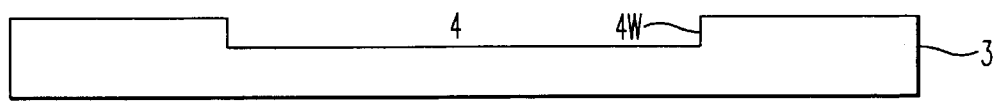

FIGS. 2a and 2b depict a plan and side views of a porous preform 3, processed as described in Examples 18 to 22 to have a groove 4 with walls 4W.

Figure 3A:
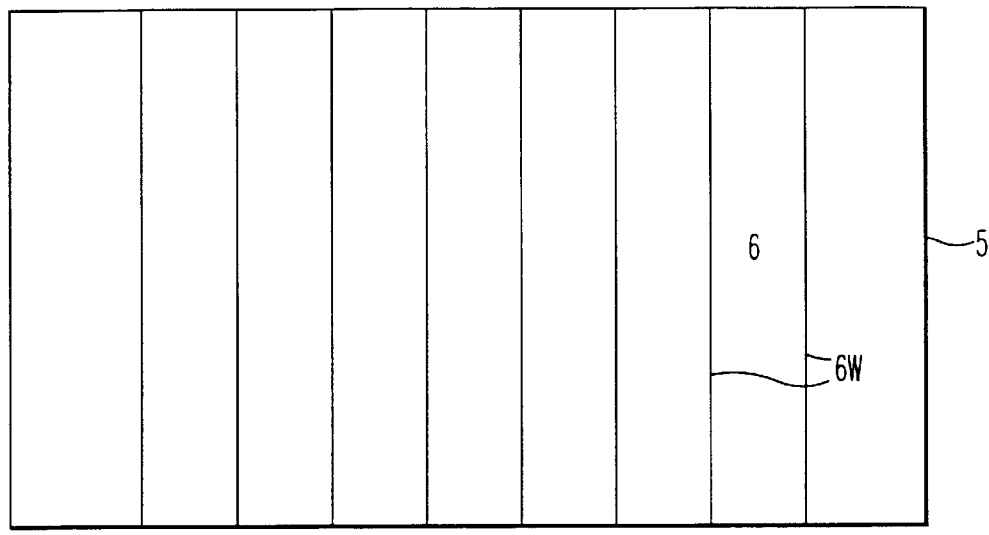
FIGS. 3a and 3b illustrate another example of a porous preform of silicon carbide to be used for the composite of the present invention.
Figure 3B:
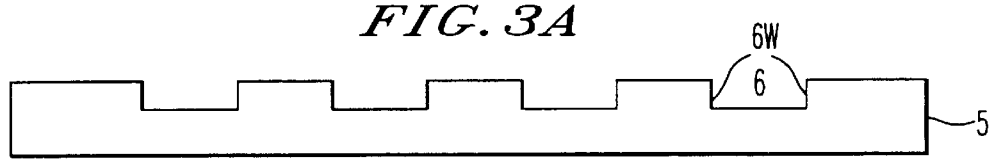

FIGS. 3a and 3b depict a plan and side views of porous preform 5 having grooves such as 6 whose walls are 6W.

Figure 4A:
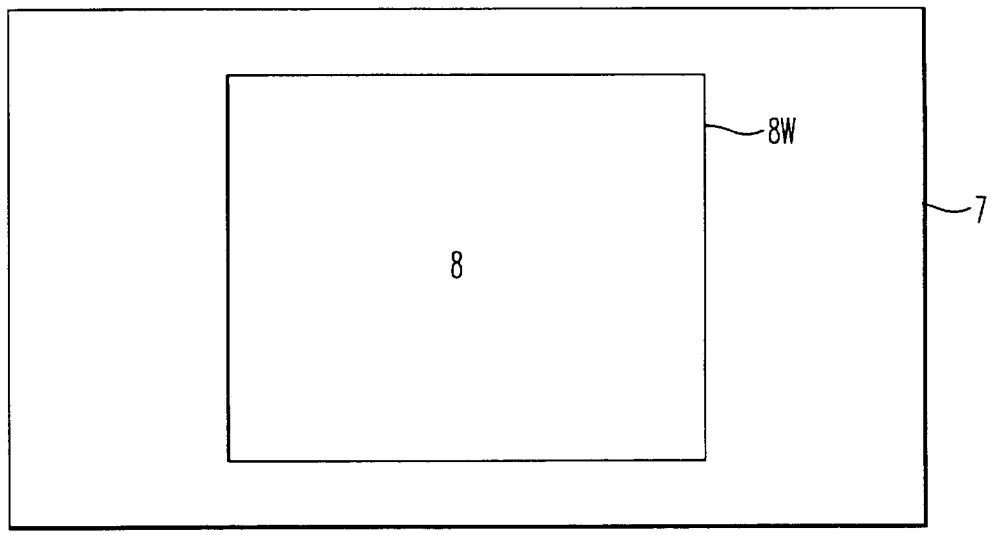
FIGS. 4a and 4b illustrate another example of a porous preform of silicon carbide to be used for the composite of the present invention.
Figure 4B:
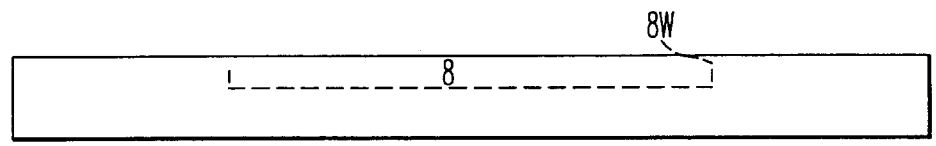

FIGS. 4a and 4b depict plan and side views of a stepped porous preform 7 where 8W designates the step bounding the dent, 8.

Figure 5A:
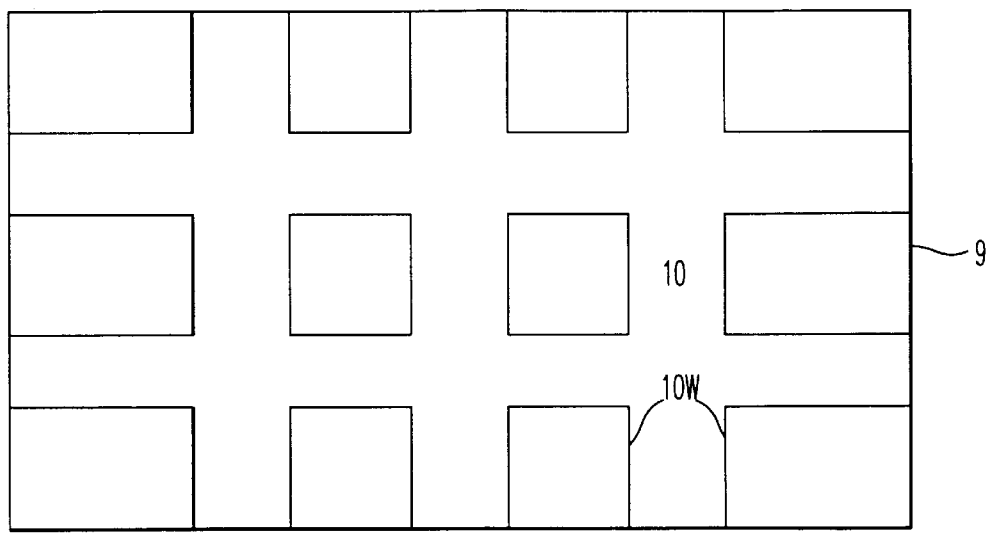
FIGS. 5a and 5b illustrate another example of a porous preform of silicon carbide to be used for the composite of the present invention.
Figure 5B:

FIGS. 5a and 5b depict another stepped porous preform 9 where 10W designates the steps bounding grooves 10.

Figure 6A:
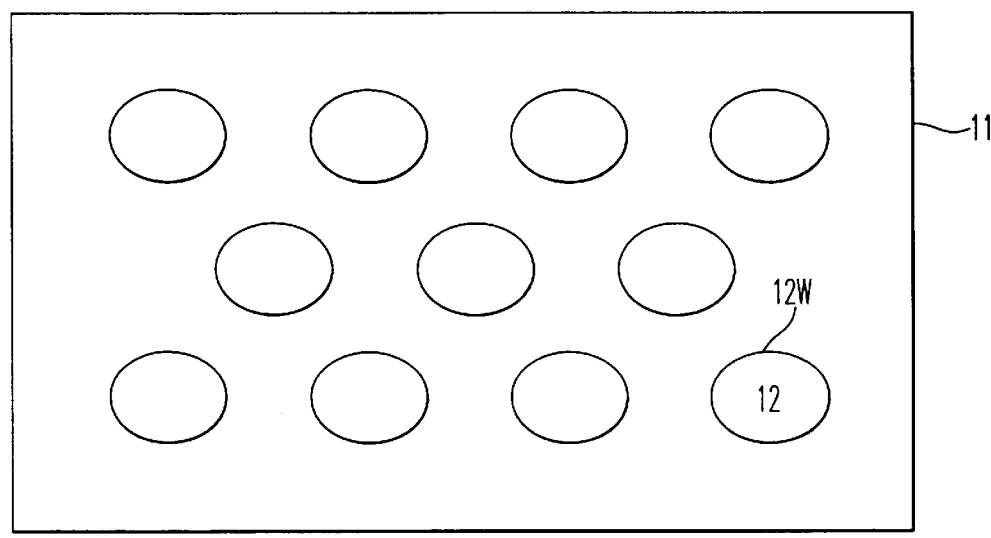
FIGS. 6a and 6b illustrate another example of a porous preform of silicon carbide to be used for the composite of the present invention.
Figure 6B:
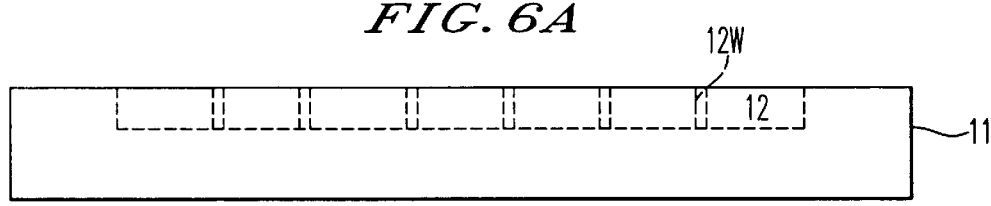

FIGS. 6a and 6b depict plan and side views of a porous preform 11 where 12 designates cylindrical recesses of circular cross section, 12W designating the walls.

Figure 7A:
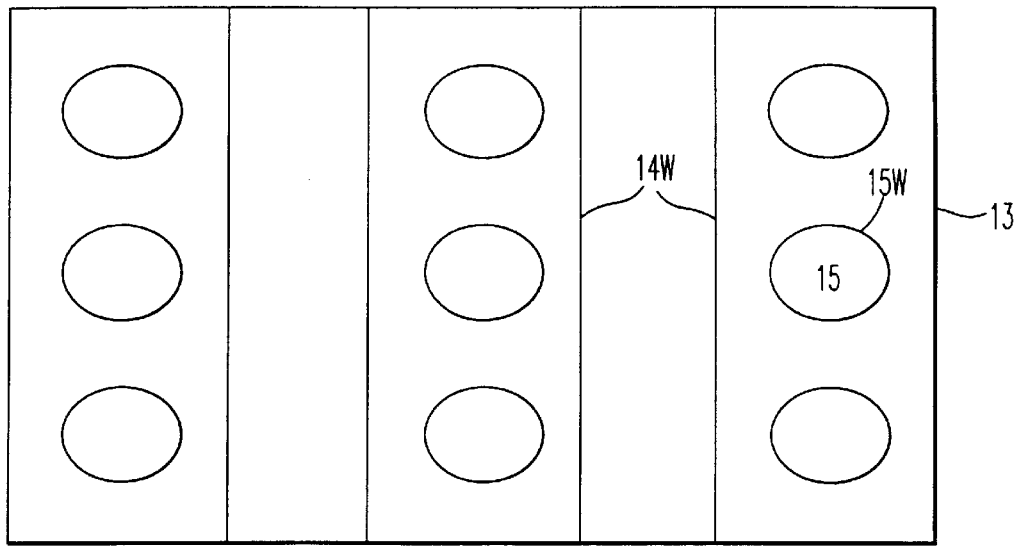
FIGS. 7a and 7b illustrate another example of a porous preform of silicon carbide to be used for the composite of the present invention.
Figure 7B:
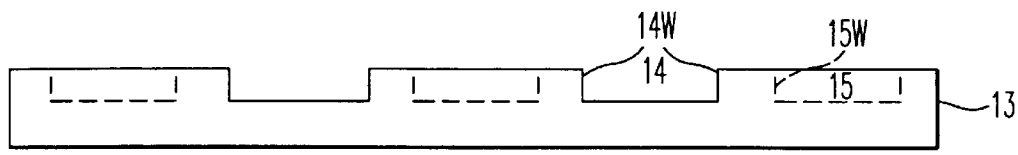

FIGS. 7a and 7b depict plan and side views of a porous preform 13 having grooves 14 having walls 14W and cylindrical dents or recesses 15 having walls 15W.

Figure 8A:
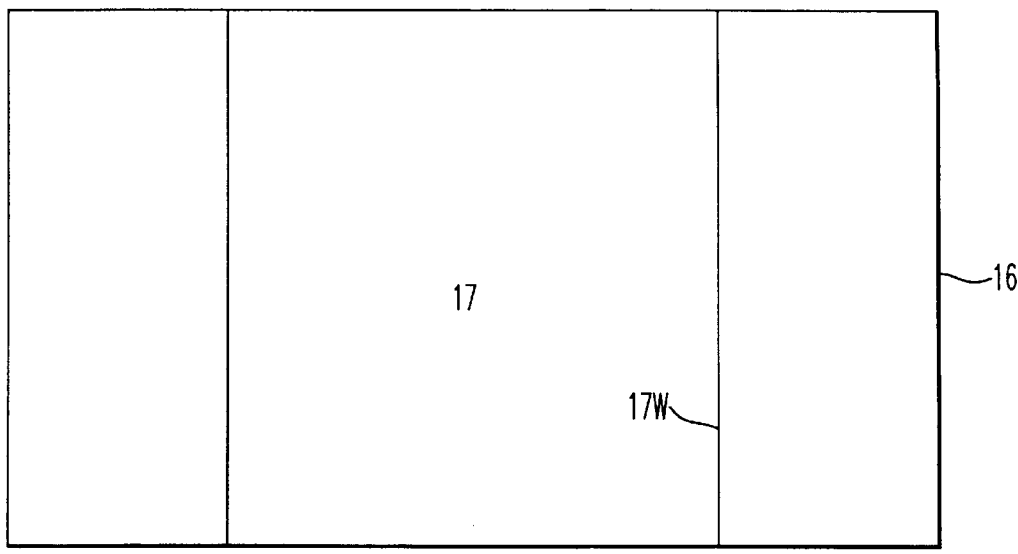
FIGS. 8a and 8b illustrate another example of a porous preform of silicon carbide to be used for the composite of the present invention.
Figure 8B:
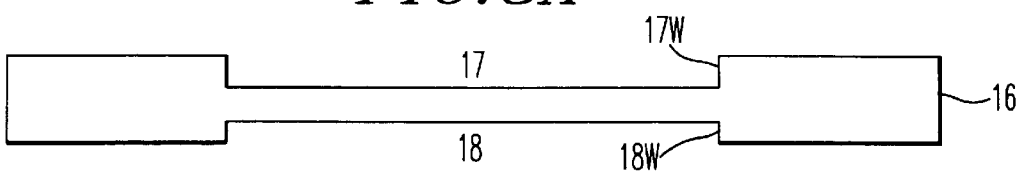
Figure 9A:
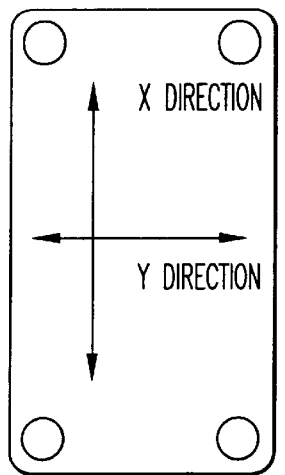
FIGS. 9a, 9b, 9c and 9d are plan views illustrating composites in the present invention.
Figure 9B:
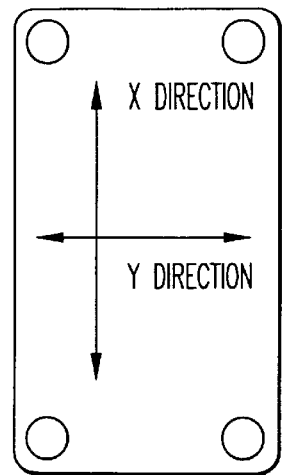
Figure 9C:
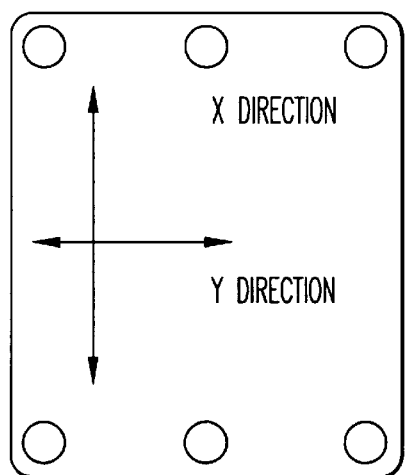
Figure 9D:
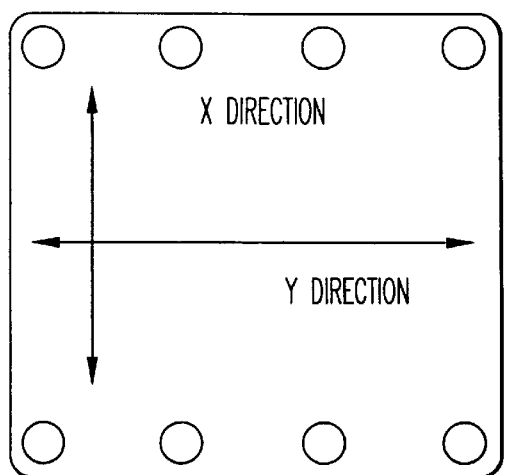

FIGS. 8a and 8b depict plans and side views of a porous preform 16 having opposed grooves 17 and 18 whose walls are 17W and 18W.

FIGS. 9a, 9b, 9c and 9d contain plan views of four flat composites of the present invention showing holes in their planes, representative examples of which are labeled 19, 20, 21 and 22, depicting also the hole-to-hole direction (X-direction) and a direction perpendicular thereto (Y-direction).

Figure 10B:
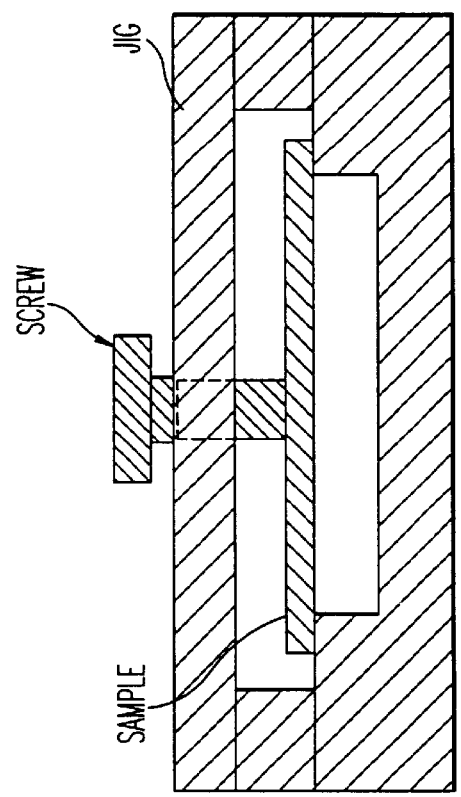
FIGS. 10a and 10b are diagrams explaining a jig to be used in Examples of the present invention.
Figure 10A:
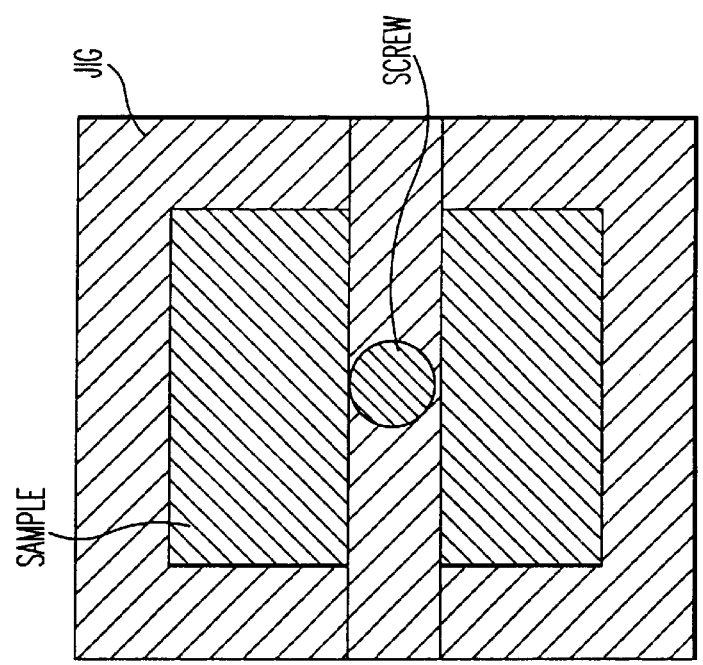

FIGS. 10a and 10b show plan and elevation views of a jig to be used to position the sample for the processing in the Examples of the present invention.

The coefficient of thermal expansion of the metal-ceramic composite is usually determined by the coefficients of thermal expansion of the ceramic as a reinforcing material and the metal as a matrix, and the composition thereof. The coefficient of thermal expansion of the ceramic is significantly small as compared with the coefficient of thermal expansion of the metal, and it is thereby effective to increase the ratio of the ceramic, to decrease the coefficient of thermal expansion of the composite. On the other hand, although the coefficient of thermal conductivity of the metal-ceramic composite is basically determined by the coefficients of thermal conductivity of the ceramic as a reinforcing material and the metal as a matrix, and the composition thereof, the coefficient of thermal conductivity is significantly influenced by the bonding state at the interface between the reinforcing material and the matrix. Usually a metal has a higher coefficient of thermal conductivity than a ceramic. However, e.g. silicon carbide (SiC), aluminum nitride (AlN) or boron nitride (BN) has a theoretical coefficient of thermal conductivity equal to or higher than a metal (at least 300 W/mK), and they are extremely promising as reinforcing materials. However, in the case of producing a composite practically, AlN and BN are expensive, and accordingly, the obtained composite will also be expensive. Further, AlN and BN are likely to be oxidized in the air, and when they are formed into a composite, a glass phase having an extremely low coefficient of thermal conductivity is likely to form between the ceramic as the reinforcing material and the metal as the matrix, and accordingly, the coefficient of thermal conductivity of the obtained composite tends to decrease.

The present inventors have conducted extensive studies on the reinforcing material, and as a result, they have found that a ceramic containing silicon carbide as the main component is suitably for producing a metal-ceramic composite having both high coefficient of thermal conductivity and low coefficient of thermal expansion.

On the other hand, to produce such a composite, wettability between the reinforcing material and the metal is important to obtain a dense composite. If the melting point of the metal to be infiltrated is high, the temperature during infiltration will be high, whereby the ceramic will be oxidized, or the ceramic may react with the metal to produce a compound having undesirable characteristics. Further, if the melting point of the metal as the matrix is high, the temperature for infiltration will be high, whereby a material of e.g. a mold material will be limited, and the molding cost itself will increase, and accordingly the obtained composite will be expensive.

The present inventors have conducted extensive studies on the metal as the matrix, and as a result, they have found that a good composite can be produced by using an alloy containing aluminum as the main component. Namely, the composite of the present invention comprises a silicon carbide powder or a porous material of silicon carbide and a metal containing aluminum as the main component infiltrated thereinto.

Characteristics of the metal-ceramic composite, such as coefficient of thermal expansion and coefficient of thermal conductivity, are determined by characteristics of the ceramic as the reinforcing material and the metal as the matrix, and the composition thereof. The content of silicon carbide in the composite of the present invention is preferably from 50 to 80 vol %, more preferably from 60 to 70 vol %. If the content of silicon carbide is less than 50 vol %, the coefficient of thermal expansion of the composite will be high, and accordingly a heat dissipation device having a high reliability, which is an object of the present invention, is less likely to be obtainable. Further, although it is effective to increase the content of silicon carbide in view of high coefficient of thermal conductivity and low coefficient of thermal expansion of the composite, if the content exceeds 80 vol %, there is a problem such that extremely high forming pressure is required, and accordingly, the cost for the metal-ceramic composite will be extremely high.

The metal in the silicon carbide composite of the present invention is an alloy containing aluminum as the main component, and preferably it contains at most 20 wt % of silicon and at most 5 wt % of magnesium. With respect to metal components in the alloy except aluminum, silicon and magnesium, e.g. copper may be contained therein within a range of not extremely changing the characteristics of the alloy. By adjusting the components in the alloy except aluminum, the coefficient of thermal conductivity or the coefficient of thermal expansion of the alloy itself can be changed, and the coefficient of thermal expansion or the coefficient of thermal conductivity of the composite to be obtained can also be adjusted. Further, by alloying silicon and magnesium with aluminum metal, the melting point of the alloy will decrease, or the viscosity of the molten metal will decrease at a high temperature, whereby a dense composite is likely to be obtained by e.g. a high-temperature molding method. Further, by alloying the aluminum metal, the hardness of the metal itself will increase, and as a result, mechanical properties of the composite such as strength will improve.

Further, in the present invention, the warpage is at most 250 $\mu$m per 10 cm of the principal plane length of the composite. If the warpage exceeds 250 $\mu$m per 10 cm of the principal plane length of the composite, when the composite of the present invention is used for a heat dissipation device, bonding to e.g. a circuit substrate will deteriorate, or an excessive bending stress will be applied to the composite when the composite is fixed on e.g. a heat dissipation fin by screws, thus leading to breakage of the composite. On the other hand, a device such as a power module having a heat dissipation device composed of such a composite incorporated therewith, is fixed on e.g. a heat dissipation fin by screws. In such a case, the surface bonding to the device such as a power module and the heat dissipation fin is preferably convex so that a stress is applied on the bonding surface, in view of heat dissipation property since the screw force after screwing will be high.

The second aspect of the present invention resides in a flat composite having at least 4 holes in its principal plane, so that the flat composite can be fixed on another heat dissipation device by screws. The shape of the holes can be optionally selected depending upon the size of e.g. the heat dissipation device, and usually the holes have such a size that screws of M6–M10 can be pierced therethrough. Depending upon the size of a heat dissipation plate, at least 4 holes can be made. However, the entire surface of the heat dissipation plate can not always be adhered to the heat dissipation device, with at most 3 holes.

In the present invention, it is essential that $50 \leq Cx \leq 250$ and $-50 \leq Cy \leq 200$, where $Cx$ is a warpage ($\mu$m) per 10 cm in a hole-to-hole direction (X direction) and Cy is a warpage ($\mu$m) per 10 cm in a direction perpendicular thereto (Y direction). Here, the hole-to-hole direction (X direction) is one direction on the surface of the heat dissipation plate, and the Y direction is a direction perpendicular to X direction on the above-mentioned surface, as illustrated in FIGS. 9(a) to (d).

The present inventors have conducted various experiments to overcome the above-mentioned problems in the prior art, and as a result, they have found that when the warpages (Cx; $\mu$m and Cy; $\mu$m) are within the above-specified range, the heat dissipation plate composed of the composite can be tightly fixed on another heat dissipation device by screws, and the present invention has been accomplished. In the case where the heat dissipation plate composed of the composite of the present invention is tightly fixed on another heat dissipation device by screws, usually they are fixed by means of a heat dissipation grease interposed therebetween. Accordingly, the absolute value of the warpage (Cy) in Y direction is preferably smaller than the thickness of the heat dissipation grease. Further, the warpage (Cy) in Y direction is preferably smaller than the warpage (Cx) in X direction, in view of deformation of the heat dissipation plate at the time of screwing. If the above-mentioned warpages are not within the above-specified ranges, the heat dissipation plate may not be tightly fixed on another heat dissipation device by screws in some cases.

The third aspect of the present invention resides in a flat composite comprising a flat composite (A) and alloy layers (B) containing aluminum as the main component, bonded to both sides of the flat composite (A). As the surface is covered with the alloy layer containing aluminum as the main component, processing of the metal part is enough for processing of the surface, and accordingly loading during the processing can significantly be reduced. This is because if a metal-ceramic composite is present at the surface, the part alone is hard, whereby the processing will be non-uniform, or an expensive processing jig of e.g. diamond will be necessary. Further, as the surface is covered with a metal layer, uniformity will improve in the case of carrying out a plating treatment. From the above-mentioned reasons, the average thickness of the metal layer is at least 10 $\mu$m.

On the other hand, since the metal layer comprises a metal containing aluminum as the main component, it has a high coefficient of thermal expansion as compared with the metal-ceramic composite portion. Accordingly, the coefficient of thermal expansion of the entire composite will increase along with the increase in the thickness of the metal layer. Accordingly, the average thickness of the metal layer is at most 150 $\mu$m.

Further, the difference in average thickness between the front and back metal layers will cause a difference in thermal expansion between the front and back sides of the composite itself, due to the difference in the coefficient of thermal expansion between the metal layer and the metal-ceramic composite, and as a result, warpage will form on the composite. If such a warpage is not controlled, it will deteriorate bonding of the composite to e.g. a circuit substrate, when the composite is used for e.g. a heat dissipation device. The warpage and the difference in thickness between the front and back metal layers are closely related to each other, and if the difference in the thickness exceeds 140 $\mu$m, the warpage of the composite will be too large, whereby the composite will no longer be suitable to be used for e.g. a heat dissipation device. Further, with respect to a flat composite having holes in its principal plane so that the composite can be fixed on another heat dissipation device by screws, in the case of a small composite having a distance between holes of at most 10 cm, the warpage is preferably at most 100 $\mu$m per 10 cm of the principal plane length of the composite, to tightly fix the heat dissipation plate on another heat dissipation device by screws.

The fifth aspect of the present invention resides in a composite having a ratio of TA/TB of from 5 to 30, where TA is the average thickness of the flat composite (A) and TB is the total of the average thicknesses of the alloy layers on both sides. If TA/TB is less than 5, said alloy layer tends to be too thick, whereby characteristics such as coefficient of thermal expansion and coefficient of heat conductivity will decrease. On the other hand, if TA/TB exceeds 30, the alloy layer on the surface tends to be too thin, and accordingly, in the case of carrying out e.g. mechanical processing of the surface, the flat composite will be partially exposed, whereby the processing jig will be broken, or the plating characteristics will deteriorate. Further, a certain level of the alloy layer thickness will be necessary also in the case of adjusting the thickness of the alloy layer on the surface to adjust the shape of the composite, specifically the warpage, and accordingly, TA/TB is required to be at most 30.

Further, the warpage is from 50 to 250 $\mu$m per 10 cm of the principle plane length of the composite, and the difference between the average thickness of the front alloy layer (B) (TB1; $\mu$m) and the average thickness of the back alloy layer (B) (TB2; $\mu$m) and the maximum length of the composite (L; cm) are such that 500<|TB1−TB2|×L<2,500. If the warpage exceeds 250 $\mu$m per 10 cm of the principal plane length of the composite, in the case of using the composite of the present invention as the heat dissipation device, bonding to e.g. a circuit substrate will deteriorate, or at the time of fixing the composite on e.g. the heat dissipation fin by screws, an excessive amount of bending stress will be applied to the composite, whereby the composite will be broken. On the other hand, a device such as a power module having a heat dissipation device composed of such a composite incorporated therewith, is fixed on e.g. a heat dissipation fin by screws. In such a case, the surface bonding to the device such as a power module and the heat dissipation fin is preferably convex so that a stress will be applied to the bonding surface, in view of heat dissipation property since the screw force after screwing will be high. Accordingly, if the warpage is less than 50 $\mu$m per 10 cm of the principal plane length of the composite, the warpage will be inadequate in the case where the composite is used for e.g. a heat dissipation device, and there will be problems in heat dissipation characteristics.

With respect to the composite having such a structure, the difference in the coefficient of thermal expansion between the alloy layer and the flat composite (metal-ceramic composite) will cause a difference in thermal expansion between the front and back sides of the composite itself, if there is a difference in thickness between the front and back alloy layers, and as a result, warpage will be formed on the composite. Such a warpage is closely related with the difference in thickness between the front and back alloy layers and with the size of the flat composite, and the warpage will be high when the difference in thickness between the front and back alloy layers is large, or the size of the flat composite is large. If |TB1−TB2|×L exceeds 2,500, the warpage of the composite will be too large, and if |TB1−TB2|×L is less than 500, the warpage of the composite will be too small, and such will cause problems as mentioned above, in the case where the composite is used for the heat dissipation device.

Further, in the present invention, at least one principal plane of the porous preform of silicon carbide has a stepped portion. As mentioned above, the composite having such a structure will have warpage due to difference in the thickness between the front and back alloy layers. As the shape of the stepped portion, a structure connected to the side surface, such as a groove, a structure not connected to the side surface, such as a dent, or a combined structure thereof, may be mentioned. The depth of the stepped portion varies depending upon the area of the stepped portion. In the case where the area of the stepped portion is large, the average depth of the stepped portion is necessary to be shallow, and in the case where the area of the stepped portion is small, the average depth of the stepped portion is necessary to be deep. Accordingly, to obtain a desired difference in the average thickness between the front and back alloy layers, a difference in volume of the stepped portion between the front and the back will be necessary. The difference in volume of the stepped portion between the front and the back is preferably from 3 to 15% of the volume of the composite. If it is less than 3%, the difference in the thickness between the front and back alloy layers tends to be small, whereby a desired warpage will not be obtained. Further, if it exceeds 15%, the difference in the thickness between the front and back alloy layers tends to be large, whereby the warpage of the composite tends to be too large, and accordingly, bonding to e.g. a circuit substrate will deteriorate in the case where the composite is used for e.g. a heat dissipation device. Further, the area of the stepped portion is preferably from 20 to 80% of the principal plane. If it is less than 20%, the average depth of the stepped portion is necessary to be extremely deep, and such is unfavorable in view of e.g. strength of the composite. On the other hand, if it exceeds 80%, the non-uniformity in the thickness of the alloy layer on the surface of the composite tends to be significant. The stepped portion may be provided on one principal plane of the porous preform of silicon carbide, or may be provided on both sides thereof, so long as there is a difference in volume of the stepped portion between the front and the back.

Further, in the present invention, the silicon carbide composite is a composite having flat composites (C and D) and metal layers (E) containing aluminum as the main component, laminated to have a structure of ECEDE, wherein the difference in the carbon content between the flat composites (C) and (D) is from 0.5 to 2.5 wt %. As the composite has a five-layer structure, the compositions of the flat composites (C and D) can be adjusted, and as a result, warpage can be added to the composite. Specifically, the difference in the carbon content corresponding to the silicon carbide content between the flat composites (C and D) is from 0.5 to 2.5 wt %. With the increase in the silicon carbide content in the composite, the coefficient of thermal expansion becomes low, and the difference in thermal expansion between the flat composite C and the flat composite D will be mainly controlled by the difference in the carbon content, and warpage will result. If the difference in the carbon content is less than 0.5 wt %, the difference in thermal expansion between the flat composite C and the flat composite D tends to be too small, whereby no adequate warpage will be obtainable. Further, the difference in the carbon content exceeds 2.5 wt %, the difference in thermal expansion between the flat composite C and the flat composite D tends to be too large, whereby the composite will not be suitable to be used for e.g. a heat dissipation device.

The warpage of the composite is preferably from 50 to 250 µm per 10 cm of the principal plane length of the composite. If the warpage exceeds 250 µm per 10 cm of the principal plane length of the composite, when the composite of the present invention is used for a heat dissipation device, bonding to e.g. a circuit substrate will deteriorate, or when the composite is fixed on a heat dissipation fin by screws, an excessive amount of bending stress will be applied to the composite, whereby the composite will be broken. On the other hand, a device such as a power module having a heat dissipation device composed of such a composite incorporated therewith, is fixed on e.g. a heat dissipation fin by screws. In such a case, the surface bonding to the device such as a power module and the heat dissipation fin is preferably convex so that a stress will be applied to the bonding surface, in view of heat dissipation properties since the screw force after screwing will be high. Accordingly, if the warpage is less than 50 µm per 10 cm of the principal plane length of the composite, the warpage will be inadequate when the composite is used for e.g. a heat dissipation device, and the object of the present invention may not be accomplished in some cases.

The present invention further provides a method for producing a silicon carbide composite, which comprises applying stress to the above-mentioned flat composite, said stress being perpendicular to the principal plane of the composite, at a temperature of at least 350° C. for plastic deformation, to obtain warpage. By the above-mentioned operation, a flat composite having the above-mentioned desired warpage can easily be obtained. In such a case, a method of jamming the composite into a mold having an inner face of a desired shape, is preferred as a high reproducibility can be obtained. Here, at a temperature of lower than 350° C., a metal in the composite, containing aluminum as the main component, does not substantially undergo plastic deformation, whereby the object of the present invention can hardly be accomplished. With respect to the upper limit of the above-mentioned temperature, if the temperature exceeds 600° C., part of the aluminum alloy may form a liquid phase, and fluidized. If the composite is heated to the temperature at which the alloy is fluidized, deformation due to solidification may result when cooled, and such is unfavorable.

Further, the composite of the present invention has a coefficient of thermal conductivity of at least 150 W/mK at room temperature (25° C.). If the coefficient of thermal conductivity is less than 150 W/mK, no adequate heat dissipation characteristics will be obtainable when used for e.g. a heat dissipation device, and the use of the composite will be limited.

Further, the composite of the present invention has an average coefficient of thermal expansion of at most $9 \times 10^{-6}$/K when heated from room temperature (25° C.) to 150° C. If the average coefficient of thermal expansion exceeds $9 \times 10^{-6}$/K when heated from room temperature (25° C.) to 150° C., when the composite is used for a heat dissipation device such as a power module, the difference in the coefficient of thermal expansion with the ceramic substrate tends to be too large, whereby cracks or fractures may form on the ceramic substrate by addition of thermal cyclings, and accordingly, the use of the composite will be limited when it is used for a heat dissipation device which requires reliability.

Further, the composite of the present invention has a light weight with a density of at a level of 3 g/cm³, as compared with a metal such as copper, and accordingly, the composite is effective to lighten the device when used for e.g. a heat dissipation device. On the other hand, the composite of the present invention has a high bending strength of at least 300 MPa, and has adequate mechanical characteristic to be used for e.g. a heat dissipation device.

The present invention further provides a heat dissipation device employing the above-mentioned composite. The heat dissipation device of the present invention has excellent thermal conductivity characteristics and adequate mechanical characteristics, and is suitable to be used as e.g. a heatsink. Further, the heat dissipation device of the present invention has a light weight with a density of at a level of 3 g/cm³, and is suitable as a heat dissipation device to be used for a transport. The heat dissipation device of the present invention has excellent heat conductive characteristics, and has an average coefficient of thermal expansion of as low as at most $9 \times 10^{-6}$/K. Accordingly, when it is used as a heat dissipation device such as a heatsink, as compared with the case where e.g. conventional copper is used, the difference in thermal expansion between the heat dissipation device and the ceramic substrate bonded thereto is small, whereby cracks or fractures on the ceramic substrate due to e.g. thermal cyclings generated during operation of a semiconductor element on the substrate. Accordingly, the heat dissipation device of the present invention is suitable as a heat dissipation device to be used for a transport such as an electric car, which requires a high reliability.

Further, along with high integration or enlargement of a semiconductor element, high heat dissipation characteristics have been required for a ceramic substrate on which the semiconductor element is loaded. Substrates of aluminum nitride and silicon nitride have excellent insulating characteristics and heat dissipation characteristics, and when they are used by bonding to the heat dissipation device of the present invention, a high reliability with few cracks or fractures due to addition of e.g. thermal cyclings, can be obtained.

Further, the heat dissipation plate of the present invention has such an advantage that when the side to which the ceramic substrate is not bonded, is subjected to bonding to a plate by means of a heat dissipation grease, at least 90% of said side adheres to the plate under a screw torque of at least 2N, and heat generated during operation of a semiconductor element on the ceramic substrate can be quickly discharged, whereby a module with a high reliability can be obtained.

As the method for producing the composite material of the present invention, a predetermined amount of e.g. silica sol and/or alumina sol as binders are mixed with a silicon carbide powder, followed by forming into a desired shape. The forming method may, for example, be dry press molding, wet press molding, extrusion molding or cast molding, and as the case requires, a binder for keeping a shape may be added. Further, as the silicon carbide powder, one type of a powder may be used, and it is more preferred to use several types of powders to readily obtain a preform having a high density. Then, the obtained preform is subjected to calcination in the air or in an inert gas atmosphere of e.g. nitrogen at a temperature of from 700 to 1,600° C., to produce a porous material of silicon carbide. The porous material can also be produced in the same manner by adding a silicon powder as the binder to the silicon carbide powder, followed by mixing. Further, the porous material of silicon carbide can be produced also by calcinating the silicon carbide powder or a mixed powder of a silicon powder with a carbon powder, in an inert gas atmosphere at a temperature of from 1,600 to 2,200° C.

The obtained porous material of silicon carbide is processed to have a predetermined shape, preliminarily heated to prevent e.g. fractures due to thermal shock, and infiltrated with a molten metal containing aluminum as the main component, heated to a temperature of at least the melting point, under a high pressure, to obtain a composite. The thickness of the alloy layer on the surface of the composite obtained by infiltration, can be adjusted by making e.g. grooves on the surface when the porous material of silicon carbide is processed. Further, it can be adjusted also by laminating a thin plate of Al alloy on the surface of the porous material, followed by infiltration. In such a case, not only the porous material but also the silicon carbide powder may be used. Further, the thickness of the metal layer on the surface of the composite can be adjusted also by machining the metal layer on the surface of the composite. Further, the composite can be produced by using e.g. a mold, arranging, in a space of the mold, a preform having a slightly smaller size than the space size, and injecting a molten metal into the space in said mold. The method of infiltrating metal components is not particularly limited, and a high-pressure casting or die casting may, for example, be employed.

Now, the present invention will be explained in further detail with reference to Examples and Comparative Examples. However, it should be understood that the present invention is by no means restricted thereto.

EXAMPLES 1 TO 10 AND COMPARATIVE EXAMPLE 1

A silicon carbide powder A (NG-220, manufactured by Taiheiyo Random Co., Ltd., average particle size: 60 μm), a silicon carbide powder B (GC-1000F, manufactured by Yakushima Denko Co., Ltd., average particle size: 10 μm) and a silica sol (Snowtex, manufactured by Nissan Chemical Industries, Ltd.) were blended with a composition as shown in Table 1, followed by mixing by an agitation mixer for 30 minutes, and the mixture was formed into a shape of 100 mm×100 mm×5 mm under a pressure of 10 MPa.

The obtained preform was heated in the air at a temperature of 850° C. for 2 hours, to obtain a porous material of silicon carbide. The obtained porous material of silicon carbide was processed into a shape of 20 mmφ×5 mm, and the relative density (bulk density) was calculated from its size and weight. The obtained results are shown in Table 1.

TABLE 1

| | Composition (vol %) | | | Thickness of preform (mm) | Relative density (%) | Type of alloy |
|---|---|---|---|---|---|---|
| | SiC (A) | SiC (B) | Silica sol* | | | |
| Ex. 1 | 25 | 75 | 3 | 2.93 | 63 | ADC12 |
| Ex. 2 | 50 | 50 | 3 | 2.93 | 63 | ADC12 |
| Ex. 3 | 75 | 25 | 3 | 2.93 | 63 | ADC12 |
| Ex. 4 | 50 | 50 | 1 | 2.93 | 62 | ADC12 |
| Ex. 5 | 50 | 50 | 7 | 2.93 | 64 | ADC12 |
| Ex. 6 | 50 | 50 | 3 | 2.93 | 63 | AC4C |
| Ex. 7 | 50 | 50 | 3 | 2.93 | 63 | AC9B |
| Ex. 8 | 50 | 50 | 3 | 2.93 | 63 | Pure Al |
| Ex. 9 | 50 | 50 | 3 | 2.90 | 63 | ADC12 |
| Ex. 10 | 50 | 50 | 3 | 2.98 | 63 | ADC12 |
| Comp. Ex. 1 | 50 | 50 | 3 | 2.60 | 63 | ADC12 |

*solid content
JIS standard products were used for the alloy

Then, the obtained porous material of silicon carbide was processed by a diamond processing jig into a thickness as shown in Table 1, 10 sample sheets of each porous material were set in a frame (material: carbon steel) as illustrated in FIG. 1, having a releasing agent coated thereon, the samples were partitioned by iron plates with a thickness of 0.7 mm having a releasing agent coated thereon, and iron plates with a thickness of 12 mm were arranged on both sides, followed by fixation by bolts and nuts of 10 mmφ, to form one block.

Then, the block was preliminarily heated to a temperature of 700° C. by an electric furnace, and arranged in a preliminarily heated pressing mold having a space with an internal dimension of 250 mm$\phi$×300 mm, and a melt of the metal as shown in Table 1 heated to 850° C. was poured thereinto, followed by pressing with a pressure of 100 MPa for 10 minutes, to infiltrate the metal into the porous material of silicon carbide. The metal lump containing the obtained composite was cooled to room temperature, followed by cutting by a wet band saw to take out the frame, and the silicon carbide composite was released from the frame. The obtained composite was subjected to grinding by using a diamond processing jig, to obtain a test specimen (3×4×10 mm) for measuring the coefficient of thermal expansion, a test specimen (10 mm$\phi$×3 mm) for measuring the coefficient of thermal conductivity at room temperature and a test specimen (3 mm×4 mm×40 mm) for evaluation of three-point bending strength. Further, by using a part of the test specimen for evaluation of three-point bending strength, the section was observed by a microscope, and the thicknesses of front and back metal layers of the composite were measured with respect to 9 points, to calculate the average thickness. The obtained results are shown in Table 2.

TABLE 2

| | Average thickness of the metal layer (mm) | | |
|---|---|---|---|
| | Front | Back | Difference in thickness |
| Ex. 1 | 50 | 40 | 10 |
| Ex. 2 | 60 | 30 | 30 |
| Ex. 3 | 40 | 50 | 10 |
| Ex. 4 | 30 | 60 | 30 |
| Ex. 5 | 50 | 40 | 10 |
| Ex. 6 | 40 | 50 | 10 |
| Ex. 7 | 50 | 40 | 10 |
| Ex. 8 | 60 | 30 | 30 |
| Ex. 9 | 90 | 30 | 60 |
| Ex. 10 | 20 | 20 | 0 |
| Comp. Ex. 1 | 350 | 50 | 300 |

Further, by using the respective test specimens, the coefficient of thermal expansion from room temperature to 250° C. by a thermal expansion meter, the coefficient of thermal conductivity at room temperature by laser flash, and the three-point bending strength by a bend-tester, were measured. Further, a warpage per 10 cm of the principal plane length of the composite was measured by a three-dimensional displacement meter. Further, the density of the composite was calculated from the size and the weight of the test specimen for measuring coefficient of thermal conductivity. The obtained results are shown in Table 3.

TABLE 3

| | Coefficient of thermal expansion ($10^{-6}$/K) | Coefficient of thermal conductivity (W/mK) | Three-point bending strength (MPa) | Density (g/cm$^3$) | Warpage*1 ($\mu$m) |
|---|---|---|---|---|---|
| Ex. 1 | 7.4 | 210 | 420 | 2.99 | 40 |
| Ex. 2 | 7.2 | 220 | 400 | 2.98 | 70 |
| Ex. 3 | 6.9 | 225 | 380 | 2.98 | 30 |
| Ex. 4 | 7.7 | 225 | 410 | 2.98 | 60 |
| Ex. 5 | 6.7 | 180 | 390 | 2.97 | 40 |
| Ex. 6 | 7.4 | 230 | 400 | 2.98 | 40 |
| Ex. 7 | 6.4 | 190 | 410 | 2.98 | 30 |
| Ex. 8 | 7.5 | 230 | 360 | 2.98 | 60 |
| Ex. 9 | 7.3 | 205 | 400 | 2.97 | 90 |
| Ex. 10 | 7.1 | 225 | 430 | 2.99 | 30 |
| Comp. Ex. 1 | 9.2 | 180 | 320 | 2.88 | 400 |

*1 Warpage per 10 cm of the sample length

The outer periphery size of each of the composites obtained in Examples 1 to 10 and Comparative Example 1 was 102×102 mm, and the dispersion in the size among the samples was at most 0.1 mm. Further, each of the samples has a thickness of the composite of 3.02 mm, and with respect to the samples except Comparative Example 1, dispersion in the thickness in the plane was also at most 0.05 mm.

EXAMPLE 11

The same operation as in Example 2 was carried out except that a frame made of silicon nitride was used instead of the frame in Example 2, and 4 holes of 10 mm$\phi$ were provided on a part of the preform, to prepare a composite, and characteristics of the obtained composite were evaluated. Release of the composite from the frame after infiltration was excellent, and no deformation of the frame or the like was confirmed. The density of the composite was 2.98 g/cm$^3$, and the average thicknesses of the front and back metal layers were both 30 $\mu$m. Further, the coefficient of thermal conductivity was 210 W/mK, the coefficient of thermal expansion was 7.1×10$^{-6}$/K, the bending strength was 400 MPa, and the warpage was 40 $\mu$m per 10 cm of the principal plane length of the composite. The size of the composite was 101×101 mm×3.01 mm, and the dispersion among the samples was very small. Further, all the holes provided on the preform were filled with the metal layer, and a hole-processing was readily carried out by a drill of high speed steel.

EXAMPLES 12 TO 17 AND COMPARATIVE EXAMPLE 2

A silicon carbide powder A (NG-220, manufactured by Taiheiyo Random Co., Ltd., average particle size: 60 $\mu$m), a silicon carbide powder B (GC-1000F, manufactured by Yakushima Denko Co., Ltd., average particle size: 10 $\mu$m) and a silica sol (Snowtex, manufactured by Nissan Chemical Industries, Ltd.) were blended with a composition as shown in Table 4, followed by mixing by an agitation mixer for 30 minutes, and the mixture was formed into a shape of 180 mm×120 mm×5 mm under a plane pressure of 10 MPa. The obtained preform was heated in the air at a temperature of 850° C. for 2 hours, to obtain a porous material of silicon carbide. The obtained porous material of silicon carbide was processed into a shape of 20 mm$\phi$×5 mm, and the relative density was calculated from its size and weight. The obtained results are shown in Table 4.

TABLE 4

| | Composition (vol %) | | | Relative density (%) | Type of alloy |
|---|---|---|---|---|---|
| | SiC (A) | SiC (B) | Silica sol* | | |
| Ex. 12 | 50 | 50 | 3 | 63 | ADC12 |
| Ex. 13 | 100 | — | 3 | 62 | ADC12 |
| Ex. 14 | — | 100 | 3 | 65 | ADC12 |
| Ex. 15 | 50 | 50 | 3 | 63 | ADC12 |
| Ex. 16 | 50 | 50 | 3 | 63 | ADC12 |
| Ex. 17 | 50 | 50 | 3 | 63 | ADC12 |
| Comp. Ex. 2 | 50 | 50 | 3 | 63 | ADC12 |

*solid content
JIS standard products were used for the alloy

Then, the obtained porous material of silicon carbide was processed by using a diamond processing jig into a plate having a thickness as shown in Table 5, the preform and an aluminum plate as shown in Table 5 were set in an iron frame with a thickness of 3 mm having a releasing agent coated thereon, and iron plates with a thickness of 12 mm were arranged on both sides thereof, followed by fixation by bolts and nuts of 10 mmϕ to form a block. Then, the block was preliminarily heated to a temperature of 700° C. by an electric furnace, and arranged in a preliminarily heated pressing mold of 250 mmϕ×300 mmH, and a melt of an alloy as shown in Table 4 heated to 850° C. was poured thereinto, followed by pressing with a pressure of 100 MPa for 10 minutes, to infiltrate the alloy into the porous material of silicon carbide. The alloy lump containing the obtained silicon carbide composite was cooled to room temperature, and the silicon carbide composite was scraped out by a diamond processing jig. The obtained composite was subjected to grinding by using a diamond processing jig to obtain a test specimen (3×4×10 mm) for measuring the coefficient of thermal expansion, a test specimen (10 mmϕ×3 mm) for measuring the coefficient of thermal conductivity at room temperature and a test specimen (3 mm×4 mm×40 mm) for evaluation of three-point bending strength. Further, by using a part of the test specimen for evaluation of three-point bending strength, the section was observed by a microscope, and the thicknesses of front and back metal layers of the composite were measured with respect to 9 points, to calculate the average thickness.

TABLE 5

| | Constitution (mm) | | | Thicknesses of composite and alloy layers (mm) | | |
|---|---|---|---|---|---|---|
| | Porous material thickness | Front Al plate | Back Al plate | Composite | Front alloy layer | Back alloy layer |
| Ex. 12 | 2.80 | 0.15 | — | 2.80 | 0.20 | 0.03 |
| Ex. 13 | 2.80 | 0.15 | — | 2.80 | 0.19 | 0.04 |
| Ex. 14 | 2.80 | 0.15 | — | 2.80 | 0.19 | 0.04 |
| Ex. 15 | 2.85 | 0.12 | — | 2.85 | 0.15 | 0.03 |
| Ex. 16 | 2.60 | 0.25 | 0.10 | 2.60 | 0.30 | 0.13 |
| Ex. 17 | 2.70 | 0.20 | 0.05 | 2.70 | 0.23 | 0.10 |
| Comp. Ex. 2 | 2.00 | 0.95 | — | 2.00 | 0.99 | 0.04 |

Then, by using the respective test specimens, the average coefficient of thermal expansion from room temperature to 250° C. by a thermal expansion meter, the coefficient of thermal conductivity at room temperature by laser flash, and three-point bending strength by a bend-testing apparatus were measured. Further, the density of the composite was calculated from the size and the weight of the test specimen for measuring coefficient of thermal conductivity. The obtained results are shown in Table 6. Further, the surface of the composite was polished by a roll polishing machine to remove a deformed layer on the surface, and the warpage of the principal plane of the composite was measured by a three-dimensional displacement meter. The obtained results are shown in Table 6.

TABLE 6

| | Coefficient of thermal expansion ($10^{-6}$/K) | Coefficient of thermal conductivity (W/mK) | Bending strength (MPa) | Density (g/cm$^3$) | Warpage*1 (μm) |
|---|---|---|---|---|---|
| Ex. 12 | 7.0 | 200 | 400 | 2.98 | 150 |
| Ex. 13 | 7.1 | 210 | 390 | 2.97 | 130 |
| Ex. 14 | 6.8 | 190 | 420 | 2.99 | 140 |
| Ex. 15 | 6.9 | 210 | 410 | 2.98 | 110 |
| Ex. 16 | 8.5 | 180 | 370 | 2.94 | 160 |
| Ex. 17 | 7.9 | 190 | 380 | 2.96 | 140 |
| Comp. Ex. 2 | 10.3 | 140 | 390 | 2.85 | 800 |

*1 Warpage per 10 cm of the sample length

EXAMPLES 18 TO 22

The porous material of silicon carbide in Example 12 was processed to have a thickness of 2.95 mm by using a diamond tool, and the surface was processed to have a shape as shown in FIG. 2 with a depth and an area as shown in Table 7. The obtained processed product was infiltrated with an alloy under the same infiltration conditions as in Example 12, to prepare a composite. The obtained composite was evaluated in the same manner as in Example 12. The results are shown in Table 8.

TABLE 7

| | Depth (mm) | Area (%) *2 | Thicknesses of composite and alloy layers (mm) | | |
|---|---|---|---|---|---|
| | | | Composite | Front alloy layer | Back alloy layer |
| Ex. 18 | 0.15 | 75 | 2.85 | 0.15 | 0.03 |
| Ex. 19 | 0.25 | 40 | 2.87 | 0.13 | 0.03 |
| Ex. 20 | 0.25 | 60 | 2.83 | 0.16 | 0.04 |
| Ex. 21 | 0.25 | 80 | 2.78 | 0.21 | 0.04 |
| Ex. 22 | 0.35 | 50 | 2.78 | 0.22 | 0.03 |

*2 Ratio to the entire surface area

TABLE 8

| | Coefficient of thermal expansion ($10^{-6}$/K) | Coefficient of thermal conductivity (W/mK) | Bending strength (MPa) | Density (g/cm$^3$) | Warpage*1 (μm) |
|---|---|---|---|---|---|
| Ex. 18 | 7.1 | 200 | 400 | 2.98 | 130 |
| Ex. 19 | 7.0 | 200 | 410 | 2.98 | 110 |
| Ex. 20 | 7.0 | 190 | 390 | 2.97 | 130 |
| Ex. 21 | 7.2 | 180 | 380 | 2.96 | 180 |
| Ex. 22 | 7.3 | 180 | 380 | 2.96 | 190 |

*1 Warpage per 10 cm of the sample length

EXAMPLE 23

The porous materials of silicon carbide in Examples 12 and 13 were processed to have a thickness of 1.9 mm by using a diamond tool, the preforms in Examples 12 and 13 were set in an iron frame with a thickness of 4 mm having a releasing agent coated thereon, and iron plates with a thickness of 12 mm were arranged on both sides, followed by fixation with bolts and nuts of 10 mm$\phi$ to form a block. Then, the block was subjected to infiltration under the same infiltration conditions as in Example 12 to prepare a composite. The obtained composite was cut by a diamond cutter, and the cut surface was observed by a stereoscope, whereupon a five-layer structure of alloy layer/composite layer/alloy layer/composite layer/alloy layer, was confirmed. Then, evaluations were carried out in the same manner as in Example 12. Of the obtained composite, the density was 2.98 g/cm$^3$, the coefficient of thermal conductivity was 200 W/mK, the coefficient of thermal expansion was 7.3×10$^{-6}$/K, the bending strength was 410 MPa, and the warpage was 150 $\mu$m per 10 cm of the principal plane length of the composite.

EXAMPLES 24 TO 31 AND COMPARATIVE EXAMPLES 3 to 6

A silicon carbide powder C (NG-150, manufactured by Taiheiyo Random Co., Ltd., average particle size: 100 $\mu$m), a silicon carbide powder B (GC-1000F, manufactured by Yakushima Denko Co., Ltd., average particle size: 10 $\mu$m) and a silica sol (Snowtex, manufactured by Nissan Chemical Industries, Ltd.) were blended with a weight ratio of 60:40:3, followed by mixing by an agitation mixer for 30 minutes, and the mixture was formed into a shape of 105 mm×155 mm×6 mm under a plane pressure of 10 MPa. Then, the obtained preform was heated in the air at 900° C. for 2 hours, to prepare a porous material of silicon carbide. The obtained porous material of silicon carbide was processed into a shape of 20 mm$\phi$×5 mm, and the relative density was calculated from its size and weight, whereupon it was 66%.

Then, the obtained porous material of silicon carbide was processed to have a thickness of 5 mm by using a diamond processing jig, preliminarily heated to 700° C. in an electric furnace, and arranged in a preliminarily heated pressing mold having an inner diameter of 250 mm and a height of 300 mm. A melt of an aluminum alloy (ADC-12) heated to 850° C. was poured thereinto, followed by pressing with a pressure of 100 MPa for 10 minutes, to infiltrate the alloy into the porous material of silicon carbide. The alloy lump containing the silicon carbide composite was cooled to room temperature, and the silicon carbide composite was scraped out by using a diamond processing jig. With respect to the obtained silicon carbide composite, the outer periphery was processed to have a shape of 100×150 mm (corner: R3), and six holes of 7 mm$\phi$ were formed on the composite (FIG. 9(b)). Then, the composite was subjected to a surface processing by a three-dimensional mill, to have a predetermined shape, thickness and warpage.

With respect to the silicon carbide composite, the thickness and the warpage were measured by a micro meter and a three-dimensional displacement meter, respectively, and it was confirmed that the composite was processed to have a desired size. The obtained results are shown in Table 9.

TABLE 9

|  | Thickness (mm) | Cx ($\mu$m) | Cy ($\mu$m) | Adhesion ratio (%) |
|---|---|---|---|---|
| Ex. 24 | 3.0 | 120 | 50 | 99 |
| Ex. 25 | 3.0 | 180 | 70 | 99 |

TABLE 9-continued

|  | Thickness (mm) | Cx ($\mu$m) | Cy ($\mu$m) | Adhesion ratio (%) |
|---|---|---|---|---|
| Ex. 26 | 3.0 | 180 | −30 | 98 |
| Ex. 27 | 3.0 | 180 | 0 | 98 |
| Ex. 28 | 3.0 | 120 | 120 | 93 |
| Ex. 29 | 3.0 | 70 | 0 | 97 |
| Ex. 30 | 4.0 | 150 | 50 | 99 |
| Ex. 31 | 5.0 | 120 | 50 | 99 |
| Comp. Ex. 3 | 3.0 | −100 | 0 | 55 |
| Comp. Ex. 4 | 3.0 | 150 | 300 | 60 |
| Comp. Ex. 5 | 3.0 | 100 | −100 | 75 |
| Comp. Ex. 6 | 3.0 | −100 | −100 | 45 |

With respect to Cx and Cy, + represents the grease coated surface being convex, and − represents concave, and they are warpages per 10 cm of the sample length.

Further, a silicon grease manufactured by Shin-Etsu Chemical Co., Ltd., was weighed and coated to have a thickness of 50 $\mu$m on one side of the composite obtained by the above-mentioned operation, and the composite was bonded to an acrylic plate with a thickness of 30 mm by screws of 6M under a screw torque of 3N. The assembly was left for 1 minute, and then the screws were taken out therefrom, and the adhesion ratio (area ratio) on the silicon grease coated surface was measured. The results are shown in Table 9.

EXAMPLES 32 TO 34

The silicon carbide composites prepared in Comparative Example 29 were set in a jig of SUS-304 as shown in FIG. 10, loaded with several displacements with a screw of M10, heated in an electric furnace of 500° C. for 30 minutes, then cooled to room temperature, and released from the load. The warpages of the obtained composites are shown in Table 10. Then, the obtained composites were evaluated in the same manner as in Example 24, and the results are shown in Table 10.

TABLE 10

|  | Cx ($\mu$m) | Cy ($\mu$m) | Adhesion ratio (%) |
|---|---|---|---|
| Ex. 32 | 120 | 50 | 99 |
| Ex. 33 | 150 | 70 | 99 |
| Ex. 34 | 180 | 90 | 99 |

EXAMPLES 35 AND 36 AND COMPARATIVE EXAMPLE 7

The silicon carbide composite prepared in Example 24 was subjected to an electroless Ni plating, to form a plating layer with a thickness of 10 $\mu$m on the surface of the composite. On the surface of the composite having plating applied thereto, a soldering paste with a thickness of 100 $\mu$m was printed by screen printing, and a commercially available aluminum nitride substrate was loaded thereon in Example 35, or a commercially available silicon nitride substrate was loaded thereon in Example 36, followed by heat treatment in a reflow furnace of 300° C. for 5 minutes to bond the ceramic substrate to the composite. In Comparative Example 7, a plating treatment was carried out in the same manner as in Example 35 by using a copper plate, and an aluminum nitride substrate was bonded to the composite.

Then, by using each composite having the ceramic substrate bonded thereto, thermal cycle test of 3,000 times was carried out at a temperature ranging from −40° C. to 150° C. In Examples 35 and 36, no cracks in the circuit of the ceramic substrate nor the separation of the circuit were confirmed after the thermal cycle test. However, in Comparative Example 7, cracks were formed in the circuit on the ceramic substrate after thermal cyclings of 30 times.

The composite of the present invention comprises a porous material of silicon carbide and a metal containing aluminum as the main component, infiltrated into the porous material. The composite of the present invention has such characteristics that it has a high coefficient of thermal conductivity, it has an average coefficient of thermal expansion close to a ceramic substrate, and it has a light weight, and the processing cost of the composite can be reduced. Accordingly, the composite of the present invention can provide a heat dissipation device which is excellent in reliability and suitable for a mobile apparatus such as an electric car, by bonding to a ceramic substrate for semiconductor, with a low cost. Further, the composite of the present invention has a certain warpage, and when it is used as a heat dissipation plate, for example, the ceramic substrate can be tightly fixed on a heat dissipation device such as a heat dissipation fin by screws, whereby a module having stable heat dissipation properties, i.e. having a high reliability, can be formed, and it is significantly useful industrially.

What is claimed is:

1. A silicon carbide composite which is a flat composite having at least 4 holes in its plane, and having a relation of $50 \leq Cx \leq 250$ and $-50 \leq Cy \leq 200$, where Cx is a warpage ($\mu$m) per 10 cm in a hole-to-hole direction (X direction) and Cy is a warpage ($\mu$m) per 10 cm in a direction perpendicular thereto (Y direction).

2. A silicon carbide composite according to claim 1 which is a flat composite comprising a porous preform of silicon carbide and a metal containing aluminum as the main component, infiltrated into the porous preform, wherein at least one principal plane of the porous preform of silicon carbide has a stepped portion.

3. A silicon carbide composite which is a flat composite according to claim 1 comprising a porous preform of silicon carbide and a metal containing aluminum as the main component, infiltrated into the porous preform, and has an average coefficient of thermal expansion of at most $9 \times 10^{-6}$/K when heated from room temperature (25° C.) to 150° C., and a coefficient of thermal conductivity of at least 150 W/mK at room temperature (25° C.).

4. A heat dissipation device which comprises the flat composite as defined in claim 1 and a ceramic substrate for semiconductor bonded thereto.

5. The heat dissipation device according to claim 4, wherein the ceramic substrate is made of aluminum nitride and/or silicon nitride.

6. The heat dissipation device according to claim 4, wherein when the side having no ceramic substrate bonded thereto is subjected to bonding to a plate by means of a heat dissipation grease, at least 90% of said side adheres to the plate under a screw torque of at least 2N.

7. A silicon carbide composite which is a flat composite comprising a composite preform (A) which is a porous preform of silicon carbide and a metal containing aluminum as the main component, infiltrated into the porous preform, wherein both front and back sides of the composite portion (A) are covered with a metal layer containing aluminum as the main component with an average thickness of from 10 to 150 $\mu$m, and the difference in the average thickness between the front and back metal layers is at most 140 $\mu$m, said flat composite having a warpage of at most 250 $\mu$m per 10 cm of the principal plane length of the composite.

8. A flat silicon carbide composite comprising a composite portion (A) which is a porous preform of silicon carbide and a metal containing aluminum as the main component, infiltrated into the porous preform, and a metal layer (B) containing aluminum as the main component, provided on at least one side of the composite, and the ratio of TA/TB is from 5 to 30, where TA is the average thickness ($\mu$m) of the composite portion (A) and TB is the total of the average thicknesses ($\mu$m) of the metal layers (B) on both sides, said flat composite having a warpage of at most 250 $\mu$m per 10 cm of the principal plane length of the composite.

9. The silicon carbide composite according to claim 8, wherein the warpage is from 50 to 250 $\mu$m per 10 cm of the principal plane length of the composite, and the product of |TB1−TB2| and the maximum length of the composite (L; cm) is from 500 to 2500, where |TB1−TB2| is the absolute value of the difference between the average thickness of the front metal layer (B) (TB1; $\mu$m) and the average thickness of the back metal layer (B) (TB2; $\mu$m).

10. A silicon carbide composite which is a flat composite comprising flat composites (C) and (D) which are porous preforms of silicon carbide and a metal containing aluminum as the main component, infiltrated into the porous preform, and metal layers (E) containing aluminum as the main component, laminated to have a structure of ECEDE, wherein the difference in the carbon content between the flat composites (C) and (D) is from 0.5 to 2.5 wt %, and the warpage is from 50 to 250 $\mu$m per 10 cm of the principal plane length of the composite.

11. A silicon carbide composite which is a flat composite comprising a porous preform of silicon carbide and a metal containing aluminum as the main component, infiltrated into the porous preform, said composite having at least 4 holes in its plane, and having a relation of $50 \leq Cx \leq 250$ and $-50 \leq Cy \leq 200$, where Cx is a warpage ($\mu$m) per 10 cm in a hole-to-hole direction (X direction) and Cy is a warpage ($\mu$m) per 10 cm in a direction perpendicular thereto (Y direction).

* * * * *